United States Patent
Kaneko et al.

(10) Patent No.: US 8,221,553 B2
(45) Date of Patent: Jul. 17, 2012

(54) METHOD FOR PRODUCING ORGANIC LIGHT-EMITTING DEVICE

(75) Inventors: Kumiko Kaneko, Yokohama (JP); Nozomu Izumi, Chiba (JP); Koichi Matsuda, Kawasaki (JP); Yukito Aota, Mobara (JP); Hiroshi Sugai, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 510 days.

(21) Appl. No.: 12/468,785

(22) Filed: May 19, 2009

(65) Prior Publication Data

US 2009/0288680 A1 Nov. 26, 2009

(30) Foreign Application Priority Data

May 21, 2008 (JP) ................................. 2008-133540
Apr. 28, 2009 (JP) ................................. 2009-108889

(51) Int. Cl.
*B08B 7/00* (2006.01)
(52) U.S. Cl. ............................................. 134/4; 134/26
(58) Field of Classification Search ........................ None
See application file for complete search history.

(56) References Cited

U.S. PATENT DOCUMENTS

| 6,988,338 B1 * | 1/2006 | Chen et al. ................... 52/171.1 |
| 2004/0137142 A1 | 7/2004 | Nishikawa |

FOREIGN PATENT DOCUMENTS

| JP | 2002-151254 A | 5/2002 |
| JP | 2004-165068 A | 6/2004 |
| JP | 2004-247239 A | 9/2004 |
| KR | 10-2005-0112315 A | 11/2005 |

* cited by examiner

*Primary Examiner* — Michael Kornakov
*Assistant Examiner* — Eric Golightly
(74) *Attorney, Agent, or Firm* — Canon U.S.A., Inc., IP Division

(57) ABSTRACT

A method for producing an organic light-emitting device is provided for an organic light-emitting device having a substrate provided with external connection terminals, organic light-emitting elements provided on the substrate, and a protective film that covers the organic light-emitting elements. The method includes, sequentially, providing a protective film removal layer on the external connection terminals, forming the protective film on the substrate, dividing the substrate on which the protective film has been formed, and cleaning the substrate with water, an aqueous solution, or a solvent. The protective film removal layer and the protective film are removed from the external connection terminals as a result of cleaning the substrate.

7 Claims, 6 Drawing Sheets

METHOD FOR PRODUCING ORGANIC LIGHT-EMITTING DEVICE

BACKGROUND OF THE INVENTION

1. Field of the Invention

The present invention relates to a method for producing an organic light-emitting device.

2. Description of the Related Art

Organic light-emitting devices, which are self-emitting devices, have recently attracted attention for application to flat panel displays, and such devices have been actively developed.

A technology relating to protective films that serve to shield from moisture and oxygen that can penetrate from outside has been studied with the object of improving light emission characteristics of organic light-emitting devices. A transparent insulating film, such as a silicon nitride film and silicon oxynitride film, can be formed as a protective film on a wide area over and on the periphery of an organic light-emitting element, which is a constituent component of an organic light-emitting device.

An external circuit such as a flexible printed circuit board (referred to hereinbelow as FPC) is electrically connected to external connection terminals of an organic light-emitting device in order to transmit display signals to the organic light-emitting device. In this case, sufficient electric connection cannot be obtained unless the protective film that is an insulating film is removed from the external connection terminals. Accordingly, a method is used by which when a protective film is formed by plasma CVD or the like, the external connection terminals are covered with a metal mask or the like to prevent the formation of the protective film on the external connection terminals.

Japanese Patent Laid-Open No. 2002-151254 discloses the four following methods that prevent the formation of a protective film on external connection terminals. With the first method, the surface of external connection terminals is depolarized before the protective film is formed. With this method, the protective film is not formed on the depolarized terminal surface, and the external connection terminals and terminal electrodes of a FPC or the like can be electrically connected by performing UV or ozone treatment of the terminal surface prior to subsequent connection to the FPC or the like. With the second method, a masking tape is pasted on external connection terminals by a method other than a metal masking method, a protective film is formed, and then the masking tape is peeled off, thereby removing the protective film together with the masking tape. With the third method, the surface of external connection terminals is covered with a thin film corresponding to an organic compound layer constituting the organic light-emitting element or a material for covering anode end portions, and photoetching is then performed using a metal mask, thereby removing the protective film together with the thin film or cover material. With the fourth method, a thin film with low adhesion to external connection terminals is provided on the surface of external connection terminals, a protective film is thereafter formed, and the protective film is then peeled off by using a tape.

Japanese Patent Laid-Open No. 2004-165068 discloses a method by which a laser removable layer is formed on a region including external connection terminals, a protective film is formed thereupon, and then laser irradiation is performed to remove the protective film together with the laser removable layer.

External connection terminals are typically provided in a range with a width of equal to or less than 5 mm along a substrate side. Therefore, in a case where a plurality of panels are produced from a large substrate a stripe-like pattern having shielding portions with a pitch of external connection terminals or a grid-like pattern in which shielding portions are provided on external connection terminals and between the panels, can be considered as a mask for use in formation of a protective film. With both pattern masks, openings are much larger than the shielding portion. Therefore, the masks have a low strength and can be easily deformed. As a result, the external connection terminals are difficult to cover reliably and the protective film can wrap around the external connection terminals and adhere thereto, thereby creating electric resistance during external circuit connection. Where the shielding portions are increased in size to impart strength to the mask, the panel frame can become wide and distance between the panels can increase, thereby decreasing the number of panels that can be produced from one substrate.

A method by which a protective film is peeled off by using a masking tape as described in Japanese Patent Laid-Open No. 2002-151254 is used for obtaining a large number of substrates from a large substrate. However, this method may require a process of pasting a masking tape before the protective film is formed, and a process of peeling the tape off after the protective film has been formed. Thus, the number of processes to be performed is increased. In all other methods disclosed in Japanese Patent Laid-Open No. 2002-151254, additional processes may also be necessary to remove the protective film. Thus, the process time required to produce an organic light-emitting device may be extended, productivity can be decreased, and production cost may be raised.

SUMMARY OF THE INVENTION

According to one aspect of the invention, a method for producing an organic light-emitting device is provided for an organic light-emitting device having a substrate provided with external connection terminals, organic light-emitting elements provided on the substrate, and a protective film that covers the organic light-emitting elements. The method includes, sequentially, providing a protective film removal layer on the external connection terminals, forming the protective film on the substrate, dividing the substrate on which the protective film has been formed, and cleaning the substrate with water, an aqueous solution, or a solvent. The protective film removal layer and the protective film are removed from the external connection terminals as a result of cleaning the substrate.

According to another aspect of the invention, a method for producing an organic light-emitting device having a substrate provided with external connection terminals, organic light-emitting elements provided on the substrate, and a protective film that covers the organic light-emitting elements. The method includes providing the substrate with a protective film removal layer on the external connection terminals and the protective film on the protective film removal layer, exposing a cross section of the protective film removal layer, and dissolving the protective film removal layer with at least one of water, an aqueous solution and a solvent.

Further features of the present invention will become apparent from the following description of exemplary embodiments with reference to the attached drawings.

DESCRIPTION OF THE EMBODIMENTS

Figure 1A:
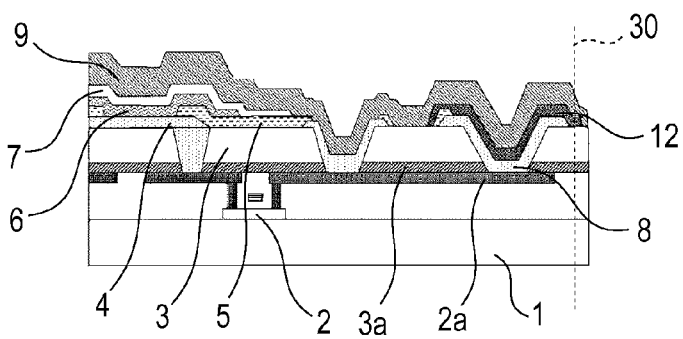
FIGS. 1A to 1D are cross-sectional schematic views illustrating an embodiment of a production method in accordance with the present invention.

An embodiment of an organic light-emitting device produced by a method in accordance with aspects of the present invention has a substrate provided with external connection terminals, a plurality of organic light-emitting elements provided on the substrate, and a protective film that covers the organic light-emitting elements.

An embodiment of a production method in accordance with aspects of the present invention includes the following processes (i)-(iv) implemented sequentially, i.e., in the order of description:

(i) a process of providing on the external connection terminals a protective film removal layer that serves to remove the protective film provided on the external connection terminals (i.e., a protective film removal layer disposition process);

(ii) a process of forming the protective film on the substrate (i.e., a protective film formation process);

(iii) a process of dividing the substrate on which the protective film has been formed (i.e., a substrate division process); and (iv) a process of cleaning the substrate (i.e., a cleaning process).

A first embodiment will be described below with reference to the appended drawings. FIGS. 1A-1D are cross-sectional schematic views illustrating the embodiment of the production method in accordance with the present invention.

First, an organic light-emitting device will be explained. In the organic light-emitting device produced in the first embodiment, a TFT circuit 2 is formed in a corresponding location on a substrate 1. Examples of the substrate 1 suitable for the organic light-emitting device can include at least one of a glass substrate, an insulating substrate comprising a synthetic resin or the like, a conductive substrate having formed on the surface thereof an insulating layer of silicon oxide, silicon nitride, or the like, and a semiconductor substrate. The substrate 1 may be, for example, transparent or non-transparent.

A planarizing film 3 comprising one or more of an acrylic resin, a polyimide resin, a norbornene resin, a fluororesin, and the like, may be formed by photolithography according to a predetermined pattern on the substrate 1 including the TFT circuit 2. The planarizing layer 3 serves to planarize concavities and convexities that may be produced when the TFT circuit 2 is provided. The material of the planarizing layer 3 and method for manufacturing same are not particularly limited, provided for example that any concavities and convexities that may be produced when the TFT circuit 2 is provided can be at least partially planarized. An insulating layer 3a comprising an inorganic material, such as for example at least one of silicon nitride, silicon oxynitride, and silicon oxide, may be formed between the planarizing film and the TFT circuit.

A lower electrode 4 is formed so as to be electrically connected to part of the TFT circuit 2 in a position corresponding to the organic light-emitting element on the planarizing layer 3. The lower electrode 4 may be, for example, a transparent electrode or a reflective electrode. In a case where the lower electrode 4 is a transparent electrode, examples of suitable constituent materials therefor can include, for example, at least one of ITO and $In_2O_3$. In a case where the lower electrode is a reflective electrode, examples of suitable constituent materials therefor can include metals, such as for example at least one of Au, Ag, Al, Pt, Cr, Pd, Se, and Ir, alloys combining a plurality of these metals, and metal compounds such as copper iodide. The lower electrode 4 may have a thickness of, for example, 0.1 µm to 1 µm.

A bank 5 is provided in the circumferential portion of the lower electrode 4. Examples of constituent materials of the bank 5 include, for example, inorganic insulating layers comprising one or more of silicon nitride, silicon oxynitride, and silicon oxide, an acrylic resin, a polyimide resin, and a novolac resin. The bank may have a thickness of, for example, 1 µm to 5 µm.

An organic compound layer 6 provided on the lower electrode 4 may be configured as a single layer or a plurality of layers, with the appropriate configuration being selected, for example, with consideration for a light-emitting function of the organic light-emitting element. Specific examples of layers constituting the organic compound layer 6 can include one or more of a hole injection layer, a hole transport layer, a light-emitting layer, an electron transport layer, and an electron injection layer. According to one version, compounds that are well-known can be used as the constituent materials of these layers. The light-emitting region of the organic compound layer 6 may be, for example, within a specific layer or at an interface of adjacent layers. The organic compound layer 6 can be formed by, for example, a vacuum vapor deposition method, an ink jet method, or the like. In the case of a vapor deposition method or the like, the organic layer can be formed using a high precision mask, and in the case of an ink jet method or the like, the organic layer can be formed on a light-emitting area by using a high-precision discharge.

An upper electrode 7 is formed on the organic compound layer 6. The upper electrode 7 may be, for example, a transparent electrode or a reflective electrode. A material similar to that of the lower electrode 4 can also be used as a constituent material of the upper electrode 7.

By forming the upper electrode 7, it may be possible to form on the substrate 1 an organic light-emitting element comprising the lower electrode 4, organic compound layer 6, and upper electrode 7. When a plurality of organic light-emitting devices are formed from a large substrate, the plurality of organic light-emitting devices can be arranged in the form of a matrix on the large substrate 10, as shown for example in FIG. 2. In one version, the external connection terminals 8 present in each organic light-emitting device may be formed simultaneously when the lower electrode 4 is formed.

An embodiment of the process (i) (protective film removal layer disposition process) will be explained below.

Figure 3A:
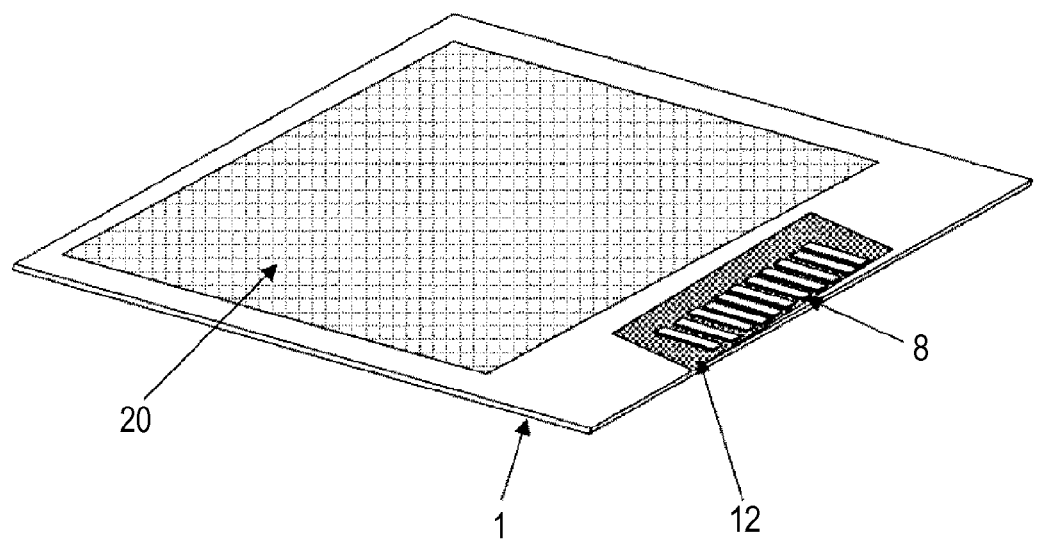
FIGS. 3A and 3B are schematic views illustrating an embodiment of a mask opening shape of external connection terminals in accordance with the present invention.
Figure 3B:
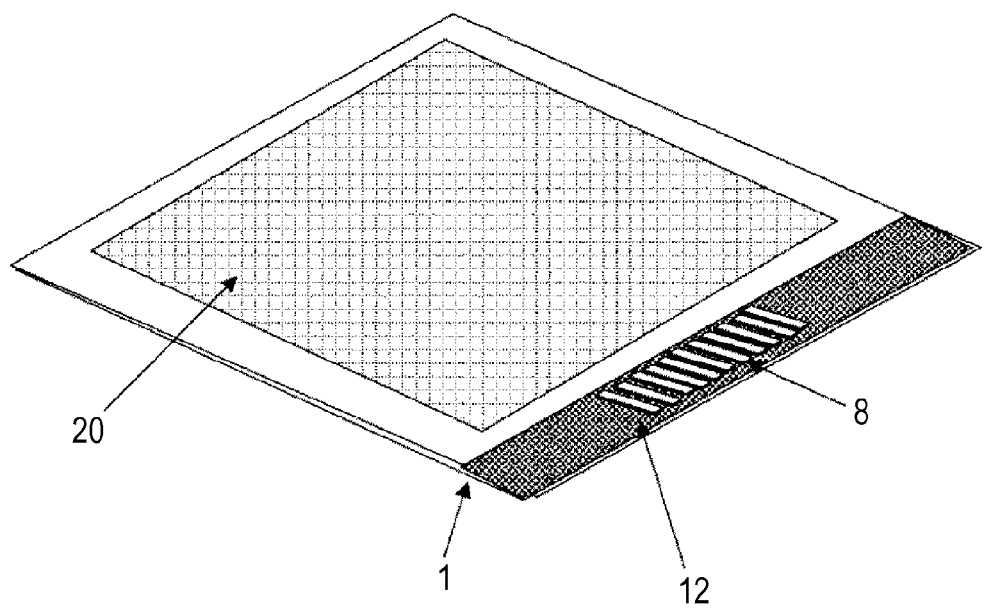

In process (i) (protective film removal layer disposition process), a soluble thin film that is a protective film removal layer 12 is formed on the external connection terminals. Examples of methods suitable for forming the soluble thin film include a vapor deposition method and a sputtering method. In one version, when the soluble thin film comprises the same material as the organic compound layer, the soluble thin film may be formed simultaneously with the organic compound layer. The soluble thin film may be formed, for example, on external connection terminals and the periphery thereof at a distance from a display region 20 where the organic light-emitting elements are disposed, as shown in FIG. 3A, or the soluble thin film may also be formed such that it extends from one end to another end of a side of the substrate where the external connection terminals are provided, as shown in FIG. 3B.

According to an embodiment of this process, a metal mask may be used to form the soluble thin film only on the external connection terminals. However, in one version, rather than shield the external connection terminals, the mask used may have openings that are much smaller than shielding portions thereof. As a result, the mask can have a high strength and may exhibit only a small amount of deformation. Therefore, problems such as film wraparound and frame expansion, which may be encountered when the protective film is formed so as to prevent the formation thereof on the external connection terminal, do not occur to an excessive extent or even at all, and the film can thus be formed in the preselected locations.

The type of soluble thin film used is not particularly limited, provided it can, for example, be dissolved in the water, aqueous solution or solvent used for cleaning in the below-described cleaning process (process (iv)). Examples of constituent materials of the soluble thin film can include at least one of an alkali metal, alkaline earth metal, alkali metal compound, alkaline earth metal compound, and organic compound. Specific examples of alkali metals can include lithium, sodium, potassium, and cesium. Specific examples of alkaline earth metals can include calcium, strontium, barium, radium, beryllium, and magnesium. Specific examples of alkali metal compounds can include hydroxides and carbonates of the aforementioned alkali metals.

Specific examples of alkaline earth metal compounds can include oxides of the aforementioned alkaline earth metals. Also, constituent materials of the organic compound layer (which may be a laminate comprising a hole transport layer, a light-emitting layer, and an electron transport layer, or any individual layer) are examples of organic compounds that can be used in the soluble thin film.

Figure 2:
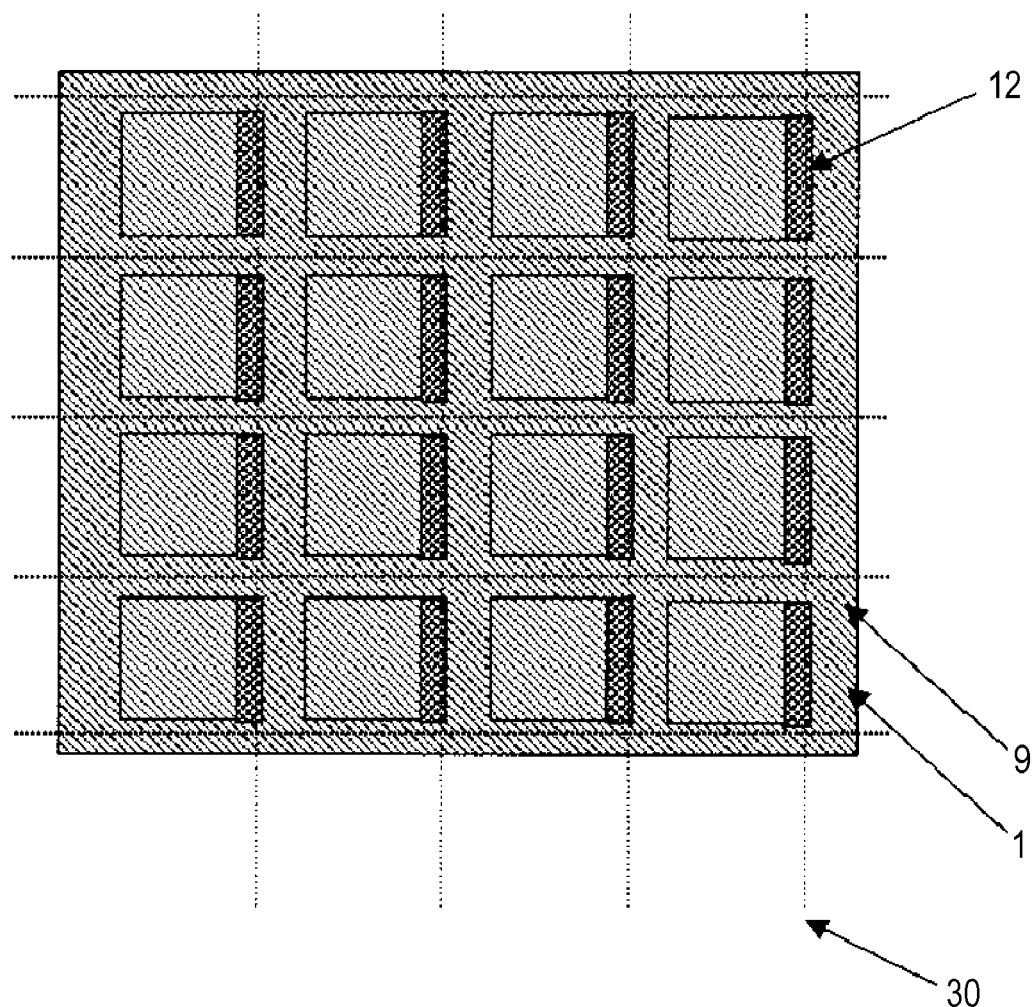
FIG. 2 is plan schematic view illustrating an embodiment of a production method in accordance with the present invention.

Process (ii) (protective film formation process) will be described below. According to aspects of the present embodiment, the soluble thin film that is a protective film removal layer 12 covering the external connection terminals 8, is formed in process (i) before the process (ii) is carried out. As a result, it may not be necessary to cover the region including the external connection terminals 8 with an area mask formed from a metal or the like. The type of constituent material of the protective film 9 that is formed so as to cover the entire surface of the large substrate 10, as shown in FIG. 2, is not particularly limited. For example, the constituent material may be selected such that the film has sufficient electric insulating properties and air impermeability, and even such that the film can at least partially prevent the organic light-emitting elements from degradation. Examples of specific materials include one or more or silicon nitride, silicon oxide, and silicon oxynitride. A vacuum vapor deposition method, a plasma CVD method, and a sputtering method, are examples of processes that can be used to form the protective film 9, but this list is not limiting. In one version, a film that has been confirmed to be impermeable to moisture or the like in an endurance test conducted under high-temperature and high-humidity conditions (for example, a temperature of 60° C. and a humidity of 90%) may be used as the protective film 9.

However, for the protective film 9 to be capable of preventing the penetration of oxygen and moisture from the outside and protecting the elements from degradation, it may be necessary to inhibit as much as possible the defects presents in the film. For this purpose, it may be necessary to control particles that may inherently be present on the substrate 1 used, particles that may be generated in the processes preceding the formation of the protective film 9, and particles that may be generated in the plasma CVD process. Furthermore, because defects can also be induced in the protective film 9 by large concavities and convexities of the substrate surface, in one version it may be the case that no acute angles with respect to the horizontal direction are present in the shape of the bank provided on the outer periphery of the lower electrode and in the shape of through holes. An aging process may also be carried out after the protective film has been formed. In an example of the aging process, the organic light-emitting devices are exposed for several hours to high-temperature and high-humidity conditions, thereby accelerating initial degradation. As a result organic light-emitting devices that do not comply with the predetermined standards can be discarded as defective.

Figure 1B:
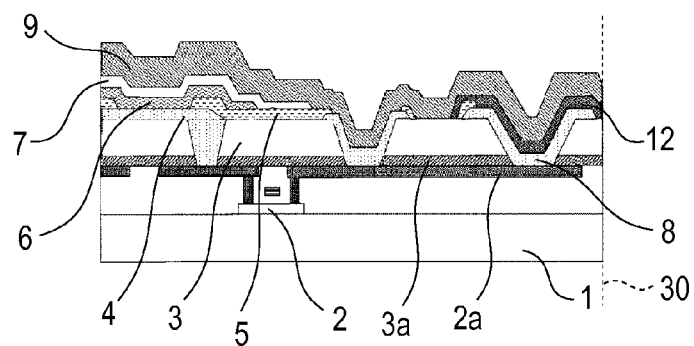

Process (iii) (substrate division process) will be described below. After process (ii) (protective film formation process) has been performed, the large substrate 10 may be cut using, for example, a scriber or laser beam. When the substrate is cut, the cutting can be performed along scribe lines 30 shown in FIG. 1A or FIG. 2. Where cutting is performed along the scribe lines 30, the cross section of the soluble thin film that is a protective film removal layer 12 formed on the external connection terminals 8 can be exposed, as shown in FIG. 1B. In a case where the substrate is cut with a scriber, cullets (i.e., cutting chips) can adhere in the vicinity of the cut portion of the substrate. Where the cullets adhere to the external connection terminals, they can cause defective connection when the external connection terminals and FPC are electrically connected in the ACF.

Therefore, cullets produced when the process (iii) (substrate division process) is carried out may be removed in the subsequent process (iv) (cleaning process). The cullets can be difficult to remove by air blowing alone. The cullets can thus be directly removed by a method of immersing in a liquid, such as water or a solvent, and subjecting to ultrasonic radiation or using a brush, while causing the liquid to flow about the substrate 10.

When the substrate 10 is cleaned, the cross section of the soluble thin film that is exposed by cutting the substrate comes into contact with the cleaning solvent (i.e., water, and aqueous solution, or other solvent). As a result, the soluble thin film starts dissolving from the cross section, and the solvent permeates further along the interface of the soluble thin film and substrate. The adhesive strength between the soluble thin film and substrate is thus reduced and even lost, and the soluble thin film can be almost entirely dissolved. As a result, the soluble thin film provided on the external connection terminals 8 can be removed and the protective film 9 provided on the external connection terminals 8 can be peeled off and removed together with the residue of the soluble thin film.

In a case where a constituent material of the soluble thin film comprises at least one of an alkali metal, an alkaline earth metal, an alkali metal compound, and an alkaline earth metal compound, the cleaning solvent that is used in process (iv) may be pure water, which can dissolve these metals and metal compounds. After cleaning with pure water, cleaning may be further conducted using an organic solvent such as an alcohol, for example, at least one of ethanol and isopropyl alcohol, or acetone.

Where a constituent material of the soluble thin film comprises an organic compound, the cleaning solvent that is used in process (iv) may be an organic solvent that can dissolve the organic compound, such as an alcohol, for example, at least one of ethanol and isopropyl alcohol, or acetone.

After cleaning with these solvents, further cleaning may also be conducted using pure water.

Figure 1C:
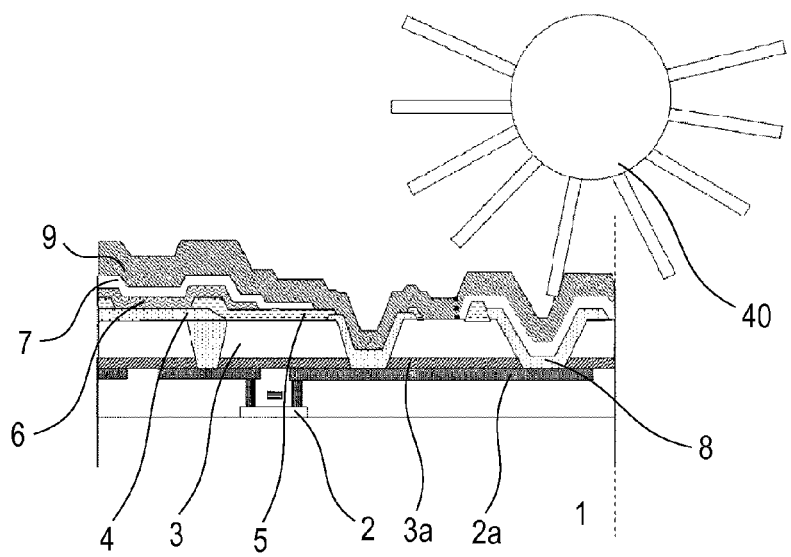

When the substrate 1 is cleaned in process (iv), the cut portion of the substrate can be brushed with a cleaning brush 40 located inside the cleaning tank, as shown for example in FIG. 1C. This method may provide for removal of thin pieces of the protective film, which pieces can be effectively removed together with any cullets that may have been generated when the large substrate was cut. Furthermore, the effect of removing the organic compound may be high when the external connection terminals 8 are wiped with cotton impregnated with an organic solvent such as an alcohol, for example, at least one of ethanol and isopropyl alcohol, or acetone that can dissolve the organic compound.

Figure 1D:
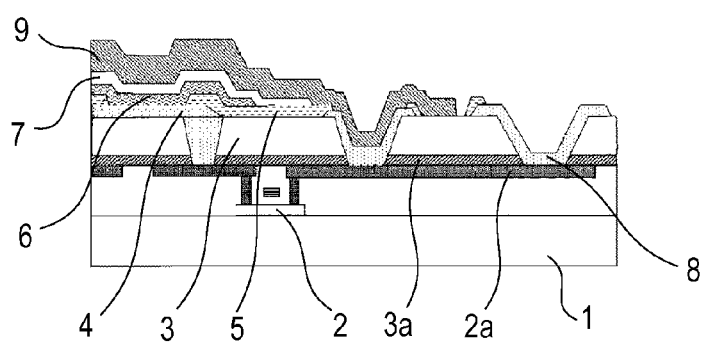

As described hereinabove, by performing process (iv), it may be possible to remove the protective film 9 provided on the external connection terminals 8, as shown in FIG. 1C and FIG. 1D.

After process (iv), the organic light-emitting devices may be dried. The drying may be performed by pulling up from warm water or with a dry air blow.

Figure 4:
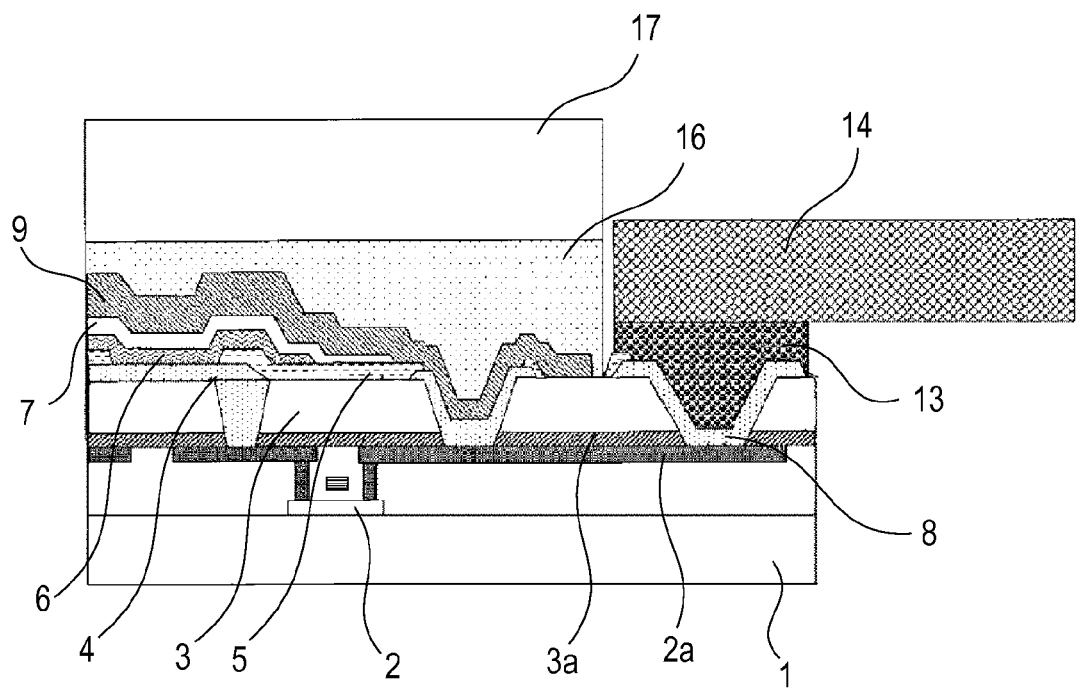
FIG. 4 is a cross-sectional schematic view illustrating an embodiment of an ACF connection state in the production method in accordance with the present invention.

A FPC 14 is then electrically connected to the external connection terminals 8 of the obtained organic-light-emitting device (FIG. 4). More specifically, an ACF 13 is pressure pre-bonded to the external connection terminals 8, and the positions of the FPC 14 and external connection terminals 8 are aligned. In one version where the pressure pre-bonding is performed, it may be performed at a low temperature. The alignment may be also performed automatically.

In the ACF 13 used, the shape of electrically conductive particles contained in the film may have protrusions. Where the surface of electrically conductive particles has protrusions, instead of being spherical, conductivity may be facilitated. The electrically conductive particles may be particles containing, for example, metal powders or resin particles coated with a metal. Carbon or the like, which is inexpensive and has high resistance to degradation, may be also used as the electrically conductive particles. The diameter of electrically conductive particles may be equal to or less than 10 μm, with a specific value depending on the thickness of the organic compound layer. The angle of the protrusions on the surface of electrically conductive particles may be equal to or less than 90°.

According to this embodiment, after the pressure pre-bonding has been conducted, thermal pressure bonding can be performed with a thermal pressure bonding head. The pressure, temperature, and time used for thermal pressure bonding are not particularly limited, provided for example that electric connection of the external connection terminals 8 with the electrode terminal of FPC 14 can be achieved.

In one version, a circularly polarizing plate 17 may be pasted via a pressure-sensitive adhesive 16 to the protective film 9 provided on the organic light-emitting elements, as shown for example in FIG. 4. The circularly polarizing plate 17 may be obtained by combining a polarizing plate and a ¼λ plate (phase difference plate), similarly to a conventional circularly polarizing plate.

According to the present embodiment, masking of the external connection terminals and/or the protective film peeling and removal process can be simplified. Furthermore, in process (iv) (cleaning process), the protective film 9 provided on the external connection terminals 8 can be peeled off and removed together with the residue of the soluble thin film. Therefore, it may not be necessary to provide a new and/or separate process for selectively peeling off and removing the protective film 9 provided on the external connection terminals 8. Therefore, the production cost of the organic light-emitting device can be reduced.

The organic light-emitting device fabricated according to the present embodiment is an active-type organic light-emitting device, but organic light-emitting devices according to aspects of the invention may also be passive-type organic light-emitting devices. Furthermore, in the organic light-emitting device fabricated according to the present embodiment, the external connection terminals are provided only on one side, but embodiments according to the present invention may also encompass a configuration in which the external connection terminals are provided on two or more sides.

A second embodiment according to aspects of the present invention will be described below. The explanation of components similar to those of the first embodiment will be omitted.

In the present embodiment, the organic light-emitting elements and external connection terminals formed on the substrate are formed by the same method as in the first embodiment.

The protective film removal layer used in the present embodiment is an organic material. In one version, the protective film removal layer may be an organic compound layer comprising an organic compound that is the same as that contained in the organic light-emitting element. Therefore, in the present embodiment, process (i) (protective film removal layer disposition process) may be carried out by forming the protective film removal layer that has a layer configuration similar to that of the organic compound layer on the external connection terminal, simultaneously with forming the organic compound layer, in the process of forming the organic light-emitting elements.

In the present embodiment, process (ii) (protective film formation process) and process (iii) (substrate division process) may be successively performed by methods similar to those of the first embodiment after process (i). Once process (iii) has been conducted, the protective film removal layer comprising the organic compound layer is exposed in the cut surface.

In the present embodiment, when process (iv) (cleaning process) is conducted, it may be that the exposed organic compound layer (exposed portion of the organic compound layer) is brought into contact with water, an aqueous solution, or solvent. Where the exposed portion is brought into contact with water, an aqueous solution, or solvent, the protective film provided on the external connection terminals may be peeled off together with the organic compound layer that is the protective film removal layer. Examples of aqueous solutions suitable for use in process (iv) can include, but are not limited to, pure water, ozone water, organic alkali cleaning solutions, DHF, and surfactant-added aqueous solutions.

In one version, the protective film may be peeled off when brought into contact with water, an aqueous solution or solvent because of a difference in absorption ratio, such as water absorption ratio, between a protective film comprising an inorganic compound and the organic compound layer comprising the organic compound.

For example, the water absorption ratio of the inorganic material constituting the protective film may be almost 0%, whereas the organic compound layer constituting the protective film removal layer may have a water absorption ratio of from $10^{-1}$% to several percents. Therefore, when the exposed portion is brought into contact with water or an aqueous solution, substantially only the protective film removal layer swells (i.e., is expanded), thereby peeling off the protective film provided on the protective film removable layer. Furthermore, because the organic compound layer may have a low adhesion to the external connection terminals, the organic compound layer sometimes can be easily peeled off from the external connection terminals by ultrasonic cleaning or brush cleaning. After process (iv) has thus been implemented, a state may be assumed in which practically no protective film or organic compound layer is formed on the external connection terminals.

The obtained organic light-emitting elements may further be subjected to aging, and the organic light-emitting devices that fail to comply with standard requirements due to initial degradation may be discarded.

When aging is performed, the organic light-emitting devices are usually allowed to stay for several hours under high-temperature and high-humidity conditions. These high-temperature and high-humidity conditions are, for example, those with a temperature of 60° C. and a humidity of 90%. Where defects are present in the protective film, changes such as white turbidity rapidly appear in the display portion of the organic light-emitting device due to exposure to such a high-temperature and high-humidity environment.

The organic light-emitting device in accordance with the present invention will be explained below in greater detail based on specific examples thereof. The present invention is not limited to the below-described examples and various changes can be made without departing from the scope of the invention.

EXAMPLES

Example 1

An organic light-emitting device was fabricated by the below-described method.
(Fabrication of Organic Light-Emitting Element and Protective Film Removal Layer)

A TFT 2 was formed on a glass substrate (substrate 1). The TFT 2 also included a signal wiring 2a. An insulating layer 3a and a planarizing layer 3 were then laminated and formed in the order of description according to a predetermined pattern on the glass substrate. A thin film made from aluminum (Al)-indium tin oxide (ITO) was then formed in pixel units on the planarizing layer 3, and a lower electrode 6 was formed. The lower electrode 6 had a thickness of 150 nm. A bank 5 (polyimide resin, trade name PHOTONEECE® DL-1000) was then formed by a photolithographic process so as to surround the circumference of the lower electrode 6 formed in the preceding process. The bank 5 had a thickness of 2000 nm.

The substrate 1 with the bank 5 formed thereon was cleaned for about 5 min with pure water and then dehydrated by baking for 2 h at about 200° C. The lower electrode formed on the substrate was then UV/ozone cleaned, and then a hole transport layer, a light-emitting layer, an electron transport layer, and an electron injection layer constituting the organic compound layer were formed in the order of description by a vacuum vapor deposition method. More specifically, the hole transport layer was formed by forming a film of N,N'-α-dinaphthyl benzidine (α-NPD) on the lower electrode 4 under pressure conditions of $1 \times 10^{-3}$ Pa. In this case, the thickness of the hole transport layer was 40 nm. A light emitting layer was then formed on the hole transport layer by vapor co-deposition of a coumarin colorant (Coumarin 540), which produces a green emission, and tris[8-hydroxyquinolinate]aluminum ($Alq_3$). In this case, the co-deposition was so conducted that the coumarin colorant took 1.0 vol. % of the entire light-emitting layer. The film thickness was 30 nm.

Then a film of the phenanthroline compound shown below was formed on the light-emitting layer and the electron transport layer was formed. The electron transport layer had a thickness of 10 nm.

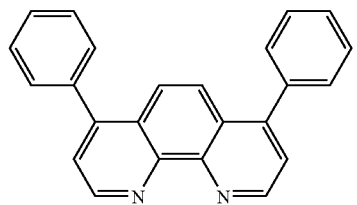

The electron injection layer was then formed on the electron transport layer by vapor co-deposition of cesium carbonate and a phenanthroline compound. In this case, the co-deposition was so conducted that the cesium carbonate took 2.9 vol. % of the entire electron injection layer. The film thickness was 40 nm.

The substrate having the electron injection layer formed thereon was moved to another sputtering apparatus, and then an upper electron 7 was formed by sputtering indium tin oxide (ITO) on the electron injection layer. The upper electrode 7 had a thickness of 60 nm.

A strontium film that was a soluble thin film was then formed by sputtering on external connection terminals 8 by using a metal alloy mask in which only the external connection terminals 8 of the organic light-emitting device were in the openings. More specifically, the organic light-emitting device was conveyed in a sputtering chamber (a sputtering target including strontium was disposed in advance inside the chamber), the external connection terminals 8 were positioned so as to overlap an area mask, and the organic light-emitting device was fixed. An argon gas was then caused to flow at 100 sccm into the sputtering chamber, the pressure in the chamber was maintained at 2.0 Pa, and a strontium film (a protective film removal film 12) was formed by inducing plasma with a DC power source. The strontium film in this case had a thickness of 100 nm (FIG. 1A).
(Formation of Protective Film and Removal of Substrate)

Then, as shown in FIG. 1B, the protective film 9 was formed on the entire organic light-emitting device by a VHF plasma CVD method, as shown in FIG. 1B, so as to cover the strontium film that was formed in the previous process. A $SiH_4$ gas and $N_2$ gas were used as the gaseous materials and the gases flowed at a flow rate of 4 sccm and 200 sccm, respectively, when the protective film was formed. Furthermore, the protective film was formed under the conditions of a high-frequency power of 40 W and a pressure of 70 Pa. The protective film had a thickness of 3 μm. After the protective film was formed, the large substrate was moved from the film formation apparatus to an antechamber, then venting was started (release of vacuum), and after the venting was completed, the chamber lid was opened and the substrate having the protective film formed thereon was taken to the outside.
(Cutting of Substrate and Cleaning of Substrate)

The large substrate on which the organic light-emitting devices were formed in a matrix-like configuration was set in a scriber so that scriber lines 30 were located on the strontium films formed on the external connection terminals 8, as shown in FIG. 2, and the substrate was cut into individual devices. Because cullets adhered to the cut portions of the organic light-emitting devices that were cut, the substrates were cleaned. The cleaning was performed in a cleaning tank containing pure water as a cleaning liquid (solvent), as shown in FIG. 1C, and using a cleaning brush 40 to clean the organic light-emitting devices. In this case, the solvent permeated along the interface of the soluble thin film and external connection terminals and the soluble thin film appeared to be dissolved. As a result, the protective film 9 formed on the external connection terminals 8 was peeled off and removed together with the residues of the soluble thin film. Then, the organic light-emitting devices were dried by dry air.

(Process of Mounting the External Circuit)

FPC mounting was then performed for electrically connecting the drive circuit serving to drive the organic light-emitting device and the external circuit. An ACF 13 was placed on the external connection terminals 8 of the organic light-emitting device and pressure pre-bonding was carried out under conditions of about 1 sec and a temperature of 80° C. A protective sheet located on the ACF 13 was removed and the FPC 14 was aligned with the external connection terminals 8. Then, a thermal pressure bonding head heated to a temperature of 230° C. was placed on the FPC 14 and pressure was applied under heating under the conditions of pressure bonding of 3 MPa and a pressure bonding time of 12 sec. As a result, the external connection terminals 8 and FPC 14 were thermally pressure bonded together.

An organic light-emitting device was then obtained by pasting a circularly polarizing plate 17 on the protective film 9 with a pressure-sensitive adhesive 16. A total of five organic light-emitting devices were produced.

A luminance was measured during light emission from organic light-emitting elements of the obtained organic light-emitting devices, and the luminance values were used to evaluate whether the external connection terminals 8 were normally mounted. The results are shown in Table 1. As for the determination criteria, the result in which the luminance decreased by 2% or more with respect to the predetermined luminance was denoted by x (poor) and other results were denoted by ○ (good).

The same method was used to determine whether the mounting of FPC 14 was normal when the thickness of the soluble thin film (protective film removal layer 12) formed on the external connection terminals 8 was changed.

TABLE 1

| Thickness of soluble thin film (strontium thin film) | Substrate No. | | | | |
|---|---|---|---|---|---|
| | 1 | 2 | 3 | 4 | 5 |
| 10 nm | ○ | ○ | ○ | x | ○ |
| 20 nm | ○ | ○ | ○ | ○ | ○ |
| 100 nm | ○ | ○ | ○ | ○ | ○ |
| 200 nm | ○ | ○ | ○ | ○ | ○ |
| 500 nm | ○ | ○ | ○ | ○ | ○ |

Notes)
x: portions where the decrease in luminance is equal to or greater than 2%;
○: luminance does not decrease over the entire area.

As shown in Table 1, where the thickness of strontium film that was a soluble thin film was 10 nm, a portion with a decrease in luminance of 5% appeared in some organic light-emitting elements of substrate No. 4 from among five organic light-emitting devices before the accelerated test. This was apparently because external connection terminals 10 could not be sufficiently covered due to a small thickness of strontium film, and the protective film was thus directly formed on part of the external connection terminals 10, thereby producing a portion where the protective film could not be peeled off and removed, which resulted in poor electric contact.

Further, an accelerated test was carried out by exposing the obtained organic light-emitting devices for 500 h under conditions of a temperature of 60° C. and a humidity of 90%. The performance of the organic light-emitting devices after the accelerated test was evaluated by a luminance measured when the organic light-emitting elements emitted light. After the accelerated test had been carried out, a decrease in luminance occurred in the organic light-emitting element of substrate No. 2, from among the five organic light-emitting devices in which the strontium film thickness was 10 nm. In the organic light-emitting devices in which the soluble thin film thickness was 20 nm to 500 nm, no portions with decreased luminance appeared even after the accelerated test. Thus, by forming the soluble thin film (protective film removal layer 12) with a sufficient thickness on the external connection terminals 8, it was possible to peel off the protective film 9 together with the soluble thin film. As a result, the FPC 14 could be normally mounted.

The organic light-emitting devices were fabricated by the above-described processes. Because the process of removing the protective film from the external connection terminals in the method for producing the organic light-emitting device in accordance with the present invention can be combined with other processes, the increase in the number of processes is small, productivity is increased, and cost can be reduced. The process of the example thus provides a method for producing an organic light-emitting device by which the number of processes to remove a protective film located on external connection terminals can be reduced, and a large number of organic light-emitting devices can be obtained from a large substrate. Thus, in the examples, the external connection terminals can be exposed without adding any special process for peeling off the protective film that covers the external connection terminal.

Example 2

Figure 5A:
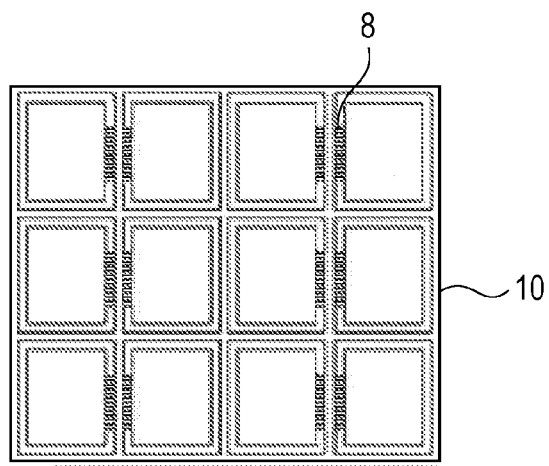
FIGS. 5A to 5C are cross-sectional schematic views illustrating an embodiment of a production method in accordance with the present invention.

Lower electrodes and all preceding components were formed on a glass substrate in the same manner as in Example 1. The difference between this example and Example 1 was that groups of external connection terminals were disposed so as to face each other on each panel of the large substrate, as shown in FIG. 5A.

Organic compound layers and upper electrodes were then successively formed on the lower electrodes and external connection terminals.

More specifically, an α-NPD film was produced and a hole transport layer was formed by a vacuum vapor deposition method. The hole transport layer had a thickness of 50 nm. Then, an alumichelate complex ($Alq_3$) and Coumarin 6 were vapor-co-deposited by a vacuum vapor deposition method at a weight ratio of 100:6 to form a light-emitting layer. The light-emitting layer had a thickness of 50 nm. A film of a phenanthroline compound (Bphen) was then produced and an electron transport layer was formed. The electron transport layer had a thickness of 10 nm. The phenanthroline compound of the preceding process and cesium carbonate ($Cs_2CO_3$) were vapor-co-deposited at a weight ratio of 100:1 and an electron injection layer was formed. The electron injection layer had a thickness of 40 nm. These organic compound layers were formed separately on the region of each organic light-emitting element separated by the bank and the external connection terminals 8 by using a mask during vapor deposition.

Figure 5B:
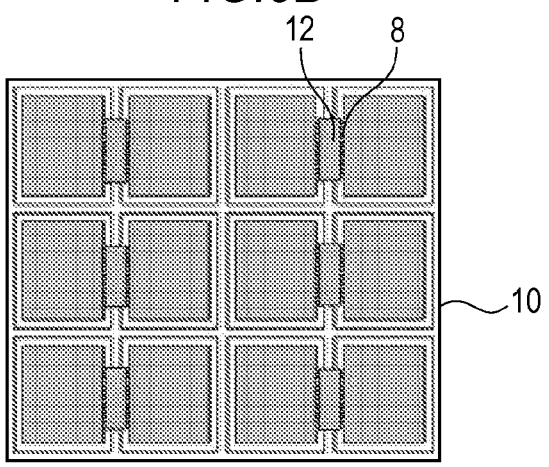

The organic compound layer provided on the external connection terminals 8 functioned as the protective film removal layer 12 (FIG. 5B).

An ITO film was then produced on the electron injection layer by a sputtering method and an upper electrode was formed. The upper electrode had a thickness of 220 nm. As a result, organic light-emitting devices arranged in a matrix-like configuration were formed on the large substrate 10.

Figure 5C:
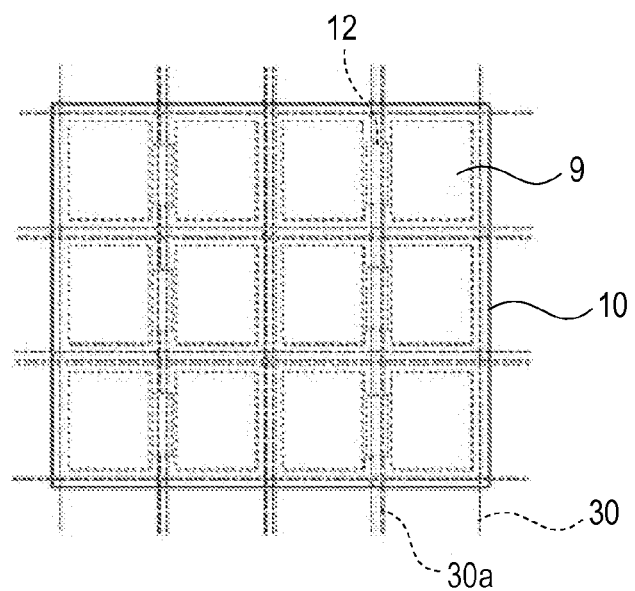

The protective film 9 was then formed by a plasma CVD method so as to cover the entire surface of organic light-emitting devices, as shown in FIG. 5C. More specifically, the film was formed by a plasma CVD method under the conditions of a high-frequency power of 80 W, a pressure of 90 Pa, and a flow rate of a $SiH_4$ gas and $N_2$ gas as gaseous materials of 10 sccm and 500 sccm, respectively. The protective film formed had a thickness of 3 μm.

The organic light-emitting devices were then divided with a scribing machine from sides where the organic light-emitting elements and protective film of the larger substrate 10 had not been formed. The cut surface of a scriber line 30 had a laminated structure comprising the protective film and glass substrate. By contrast, the cut surface of the scribe line 30a that was the closest to the external connection terminals had a laminated structure comprising the protective film, organic compound layer, and glass substrate.

The divided organic light-emitting devices were cleaned with a brush, and cullets (i.e., cutting chips) that adhered to the cut surface were removed. During brush cleaning, a rotating brush 40 was rotated within a range of 10 mm from the cut surface to remove the cullets that were present in a large amount in the vicinity of the cut surface. Pure water was used as the cleaning liquid during the cleaning. As a result, on the scribe lines 30a that were the closest to the external connection terminals, the organic compound layer and protective film provided on the external connection terminals were peeled off together and almost entirely removed. This was apparently possible because the constituent material of the organic compound layer absorbed water and swelled, whereas the protective film demonstrated practically no swelling. As a result, the protective film peeled off from the organic compound layer, and the organic compound layer that had a low adhesion to the external connection terminals was also cleaned and removed by brush cleaning.

The organic light-emitting devices were then heated to 80° C. and dried. The above-described process produced organic light-emitting devices.

An ACF of a predetermined length was then pressure prebonded to the external connection terminals. Plastic beads with a diameter of about 5 μm that were plated with gold were used as electrically conductive particles 13a contained in the ACF 13. The electrically conductive particles 13a had formed thereon protrusions with a height of about 0.5 μm, and did not have a spherical shape. The surface thereof was coated with gold. A substrate alignment mark and a FPC alignment mark of FPC were then aligned. After the marks were aligned, the structure was set below a thermal pressure bonding head), a heater head was heated to a melting temperature of the ACF, and pressure bonding was completed at a bonding pressure of 3 MPa and a pressure bonding time of 15 sec. A total of four organic light-emitting devices were thus fabricated.

(Evaluation of Organic Light-Emitting Devices)

Figure 6:
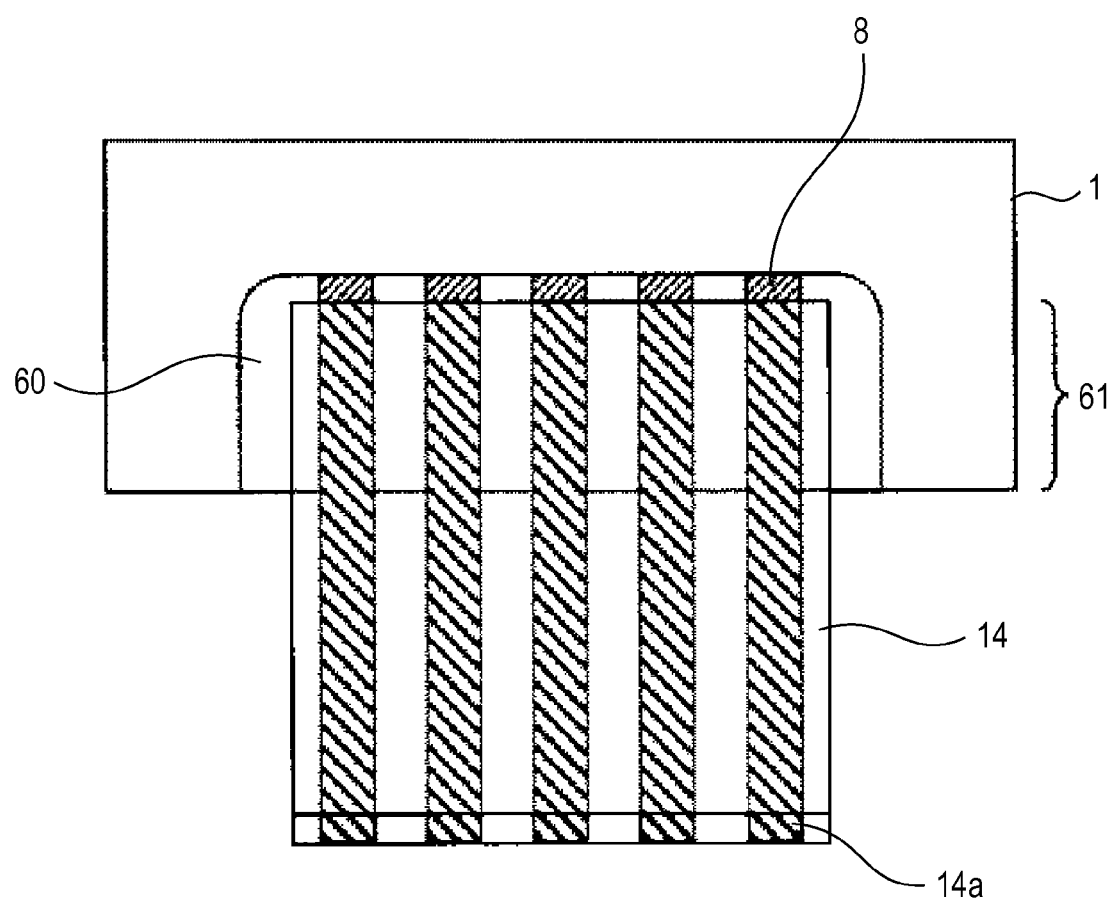
FIG. 6 shows an example of a location in which contact resistance is measured in Example 2.

First, a contact resistance of external connection terminals in the obtained organic light-emitting device was measured. As shown in the example of FIG. 6, a region 60 from which the protective film and organic compound layer were removed was present on the substrate 1 of the organic light-emitting device, and the external connection terminals 8 were exposed in this region. A region 61 in which the ACF was pasted was present on the external connection terminals 8, and the FPC 14 was pressure bonded from thereabove.

An initial resistance value between the external connection terminals 8 and a terminal portion 14a of the FPC 14 was measured. The measurements were carried out by using a digital multimeter VOAC (Iwatsu Co., Ltd.).

The contact resistance of any five lines (per one device) from among the external connection terminals was within a range of 3.0Ω to 5.0Ω for all four fabricated organic light-emitting devices for which the measurements were performed.

When a light emission signal was supplied from an external circuit to the fabricated organic light-emitting devices, all the four organic light-emitting devices were confirmed to emit light.

An endurance test was then performed under high-temperature and high-humidity conditions with respect to the organic light-emitting devices fabricated in the present example. The test was carried out under the conditions of a temperature of 60° C. and a humidity of 90%. The contact resistance of external connection terminals was measured by the above-described method with respect to the organic light-emitting devices after the test. The results demonstrated that the increase in resistance over that before the endurance test was within 10%. When a light emission signal was supplied from an external circuit to the tested organic light-emitting devices, all the four organic light-emitting devices were confirmed to emit light.

Thus, it was possible to remove the protective film present on the external connection terminals at a low cost, without using the conventional masking method and photolithography method, and without any additional process. Furthermore, the mounted portion of the organic light-emitting device fabricated in the present example was found to have endurance similar to that of the conventional configurations.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-133540, filed May 21, 2008, and No. 2009-108889 filed Apr. 28, 2009, which are hereby incorporated by reference herein in their entirety.

What is claimed is:

1. A method for producing an organic light-emitting device, the organic light-emitting device having a substrate provided with external connection terminals, organic light-emitting elements provided on the substrate, and a protective film that covers the organic light-emitting elements, the method comprising, sequentially:

providing a protective film removal layer on the external connection terminals;

forming the protective film on the substrate by plasma CVD method;

dividing the substrate on which the protective film has been formed; and cleaning the substrate with water, an aqueous solution, or a solvent, wherein the protective film removal layer is a soluble film that is dissolved in the water, aqueous solution, or solvent used in cleaning the substrate, and the protective film removal layer and the protective film are removed from the external connection terminals as a result of cleaning the substrate.

2. The method for producing an organic light-emitting device according to claim 1, wherein the protective film removal layer comprises at least one of an alkali metal, alkaline earth metal, alkali metal compound, alkaline earth metal compound, and organic compound.

3. The method for producing an organic light-emitting device according to claim 1, wherein the protective film removal layer comprises an organic compound layer that is expanded by the water, aqueous solution, or solvent used in cleaning the substrate.

4. The method for producing an organic light-emitting device according to claim 3, wherein the protective film removal layer comprises an organic compound that is the same as an organic compound contained in the organic light-emitting elements.

5. The method for producing an organic light-emitting device according to claim 1, wherein the substrate is divided so that a cross section of the protective film removal layer is exposed, and the protective film removal layer is dissolved in cleaning the substrate.

6. The method for producing an organic light-emitting device according to claim 1, wherein the protective film removal layer is formed by a vapor-deposition method or a sputtering method using an area mask having openings at positions corresponding to external connection terminals.

7. The method for producing an organic light-emitting device according to claim 1, wherein the cleaning process is carried out with ultrasonic radiation or a brush.

* * * * *